(12) United States Patent
Naylor

(10) Patent No.: US 8,571,235 B2
(45) Date of Patent: Oct. 29, 2013

(54) METHOD AND DEVICE FOR PROVIDING A PLURALITY OF AUDIO FILES WITH CONSISTENT LOUDNESS LEVELS BUT DIFFERENT AUDIO CHARACTERISTICS

(75) Inventor: Patrick Naylor, Marlow (GB)

(73) Assignee: Nuance Communications, Inc., Burlington, MA (US)

( * ) Notice: Subject to any disclaimer, the term of this patent is extended or adjusted under 35 U.S.C. 154(b) by 0 days.

(21) Appl. No.: 13/447,502

(22) Filed: Apr. 16, 2012

(65) Prior Publication Data

US 2012/0209602 A1 Aug. 16, 2012

Related U.S. Application Data

(63) Continuation of application No. 13/220,234, filed on Aug. 29, 2011, now abandoned, which is a continuation of application No. 13/002,870, filed as application No. PCT/US2009/049135 on Jun. 30, 2009, now abandoned.

(60) Provisional application No. 61/079,835, filed on Jul. 11, 2008.

(51) Int. Cl.
*H03G 3/00* (2006.01)

(52) U.S. Cl.
USPC ............................... 381/107; 381/104

(58) Field of Classification Search
USPC .................................. 381/104–109
See application file for complete search history.

(56) References Cited

U.S. PATENT DOCUMENTS

| | | | | |
|---|---|---|---|---|
| 4,466,119 A | * | 8/1984 | Peters et al. | 381/108 |
| 4,591,928 A | | 5/1986 | Bloom et al. | |
| 5,566,237 A | * | 10/1996 | Dobbs et al. | 381/103 |
| 5,812,969 A | | 9/1998 | Barber, Jr. et al. | |
| 6,148,085 A | * | 11/2000 | Jung | 381/104 |
| 6,731,767 B1 | * | 5/2004 | Blamey et al. | 381/312 |
| 7,272,235 B2 | * | 9/2007 | Lu et al. | 381/104 |
| 7,469,208 B1 | * | 12/2008 | Kincaid | 704/224 |
| 7,995,775 B2 | * | 8/2011 | Chen | 381/107 |
| 2002/0076072 A1 | * | 6/2002 | Cornelisse | 381/312 |
| 2004/0002781 A1 | | 1/2004 | Johnson | |
| 2004/0044473 A1 | * | 3/2004 | Leem | 701/211 |
| 2006/0106472 A1 | * | 5/2006 | Romesburg et al. | 700/94 |
| 2008/0003983 A1 | | 1/2008 | Bodo et al. | |
| 2008/0013751 A1 | | 1/2008 | Hiselius | |

OTHER PUBLICATIONS

International Search Report from International application No. PCT/US2009/049135 mailed Dec. 2, 2009.

* cited by examiner

*Primary Examiner* — Samuel G Neway
(74) *Attorney, Agent, or Firm* — Wolf, Greenfield & Sacks, P.C.

(57) ABSTRACT

The invention provides a method and device for enhancing the listening qualities of an audio file by providing the listener with a plurality of modified equalized audio files. Each modified equalized audio file having a consistent loudness level but different audio characteristics. Hence, for an input audio file the current invention allows the listener to individually select the best audio characteristics for them to listen to the content of the input audio file according to their particular requirements without them needing to adjust the loudness level in playback. The invention further enables the listener to switch between the multiple equalized audio files during playback. The invention further includes a SN detector and reducer to eliminate the adverse effects of the presence of sudden, strong noise in the input audio file in the process of generating the plurality of modified equalized audio files.

16 Claims, 8 Drawing Sheets

METHOD AND DEVICE FOR PROVIDING A PLURALITY OF AUDIO FILES WITH CONSISTENT LOUDNESS LEVELS BUT DIFFERENT AUDIO CHARACTERISTICS

RELATED APPLICATIONS

This Application claims the benefit under 35 U.S.C. §120 and is a continuation (CON) of U.S. application Ser. No. 13/220,234, entitled "METHOD AND DEVICE FOR PROVIDING A PLURALITY OF AUDIO FILES WITH CONSISTENT LOUDNESS LEVELS BUT DIFFERENT AUDIO CHARACTERISTICS" filed on Aug. 29, 2011, which claims the benefit under 35 U.S.C. §120 and is a continuation (CON) of U.S. application Ser. No. 13/002,870, entitled "METHOD AND DEVICE FOR PROVIDING A PLURALITY OF AUDIO FILES WITH CONSISTENT LOUDNESS LEVELS BUT DIFFERENT AUDIO CHARACTERISTICS" filed on Jan. 6, 2011, which is a national stage of Application PCT/US2009/049135, which claims priority under 35U.S.C. §119(e) to U.S. Provisional Application Ser. No. 61/079,835, entitled "METHOD AND DEVICE FOR PROVIDING A PLURALITY OF AUDIO FILES WITH CONSISTENT LOUDNESS LEVELS BUT DIFFERENT AUDIO CHARACTERISTICS" filed on Jul. 11, 2008, each of which is herein incorporated by reference in their entireties.

TECHNICAL FIELD

The current invention relates to methods and devices used in processing audio files to provide clarity and ease of use to a listener. As used herein, an audio file also includes audio/visual recordings or other multimedia files with audio content.

BACKGROUND ART

In today's era of modern communications, a listener is often required to play back recorded audio files. For example, in telecommunication systems, a person often needs to listen to recorded voicemails. Further, mobile devices such as personal digital assistants (PDAs), portable computers, and media players (i.e. mp3 players) can replay recorded audio files with different formats from different distribution systems, i.e. the internet (emails, podcasts, etc.) and telecommunication systems.

In addition, all recorded audio files have different audio characteristics based on the environment the audio file was recorded in; and how the various distribution systems processed the audio file. As a result, different audio files have different loudness levels, gain levels across frequencies, background noise levels, signal to noise ratios, and so forth.

TECHNICAL PROBLEM

Due to different audio characteristics of the recorded audio files, the listener may have varying experience listening to the different audio files. Sometimes this can be an unpleasant and frustrating experience. For example, in listening to voicemails, a listener may spend an excessive amount of time and effort in repeatedly playing the voicemail to fully comprehend the message.

Further, it is well-known that different people have their own individual listening characteristics and different people will comprehend the same audio file differently because of these individual listening characteristics.

In addition, speech in different audio files has different loudness levels. Therefore, to listen to different audio files at the same volume/loudness level, the listener needs to manually change the volume/loudness level accordingly, for every audio file being played back.

Another problem with voicemail messages may be the presence of a sudden noise in the audio file. For example, a slam-down noise at the end of a voicemail is made when a handset is put down on the station of a conventional telephone. Such sudden noises have a higher level of loudness than the speech in the audio file. Therefore, producing a consistent and suitable loudness playback level for audio files with sudden noises is a challenging task.

In light of the foregoing, there exists a need for a method to provide user selectable audio characteristics to apply to an audio file. The method should also be able to eliminate the effect of sudden noises, if any, from the playback of the audio file.

TECHNICAL SOLUTION

The current invention provides a method and device for providing the listener with a plurality of modified equalized audio files from an input audio file; each modified equalized audio file having a consistent loudness level but different audio characteristics. Hence, for each input audio file the current invention creates multiple modified equalized audio files that allow a listener to individually select the best audio characteristics for them to listen to the content of the input audio file. A plurality of equalizer profiles is provided to the user. The user selects the best fit equalizer profile for the audio file according to their particular requirements.

a. In one embodiment of the current invention, the invention generates a plurality of audio files with consistent loudness levels but different audio characteristics by performing the following steps: The input audio file is processed under a plurality of equalization profiles to provide a plurality of equalized audio files,
 b. Each equalized audio file is measured for its activity level,
 c. The measured activity level for each equalized audio file is used to calculate a loudness multiple needed to ensure that the loudness of the resulting modified equalized audio file is set at a predetermined loudness level,
 d. Each equalized audio file is multiplied by its loudness multiple to produce an modified equalized audio file, and
 e. The plurality of modified equalized audio files is made available to the listener for playback selection.

In a further embodiment of the current invention, the invention has a sudden, strong noise (hereinafter an "SN") detection and reduction process to remove the effects that SNs in the input audio file may have on calculating an equalized audio file's activity level.

In a further embodiment of the current invention, the invention includes a non-linear compressor to reduce the effects of any loud or annoying sounds made by the presence sudden noises, hard-clips, and other similar sounds present in the input audio file.

In yet another aspect of the embodiment of the current invention, a telephone set is provided. The telephone set offers a plurality of selectable equalizer profiles to the user to choose from. During a telephonic conversation, the user can apply any of these equalizer profiles, which enhances the quality of the audio. Moreover, based on the user feedback, a best-fit equalizer can be selected and offered to the user as a default option.

ADVANTAGEOUS EFFECTS

An advantage of the current invention is that the audio played back to the user has same level of loudness, irrespective of the preset equalizer (audio characteristics) selected by the user. Another advantage of the present invention is that the predetermined loudness level can be specified and matched. Another advantage of the invention is that it provides automatic gain control using the activity level detection. Yet another advantage of the invention is that it enhances the listening experience of the user by offering him a plurality of selectable preset equalizer settings. Still another advantage of the invention is that it provides same level of loudness to the listener independent of any sudden, strong noise present in the audio file.

DETAILED DESCRIPTION OF THE INVENTION

The objective of the audio enhancement process is to provide to the user with an option of listening to the same message with different audio characteristics, but a consistent level of loudness. This option enables the user to listen to the same audio file under different audio characteristics in order to help the user fit the content of the audio file to their own personal listening preferences and needs.

Figure 1:
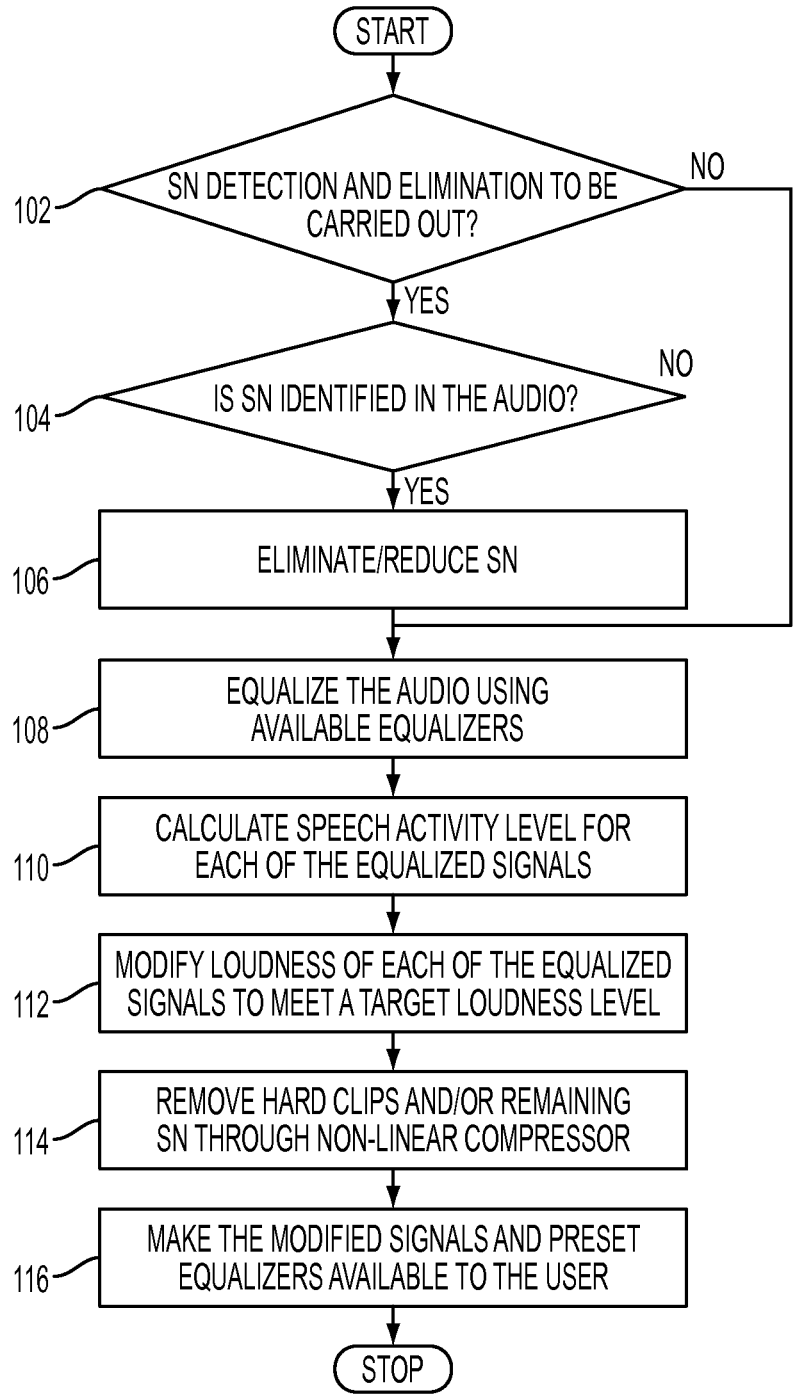
FIG. 1 is a flowchart that shows the steps to provide a user with a plurality of modified equalized audio files from an input audio file, in accordance with an embodiment of the current invention.
Figure 2:
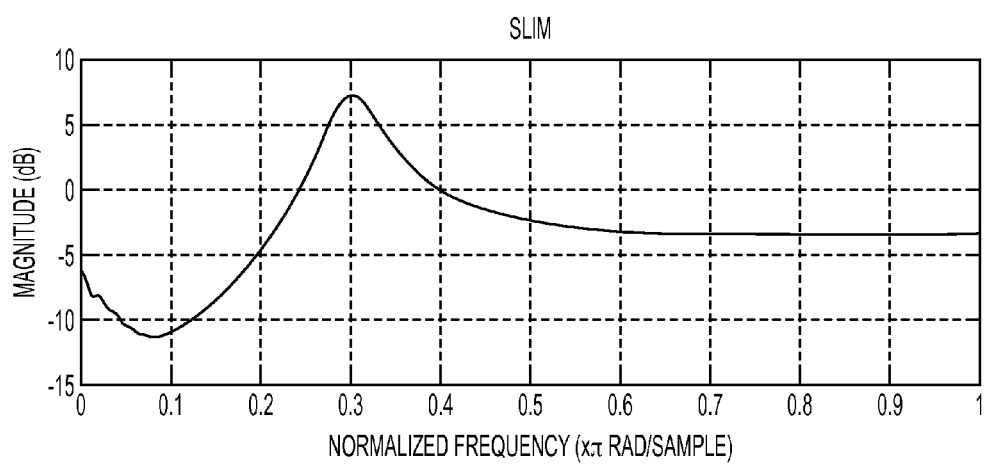
FIG. 2 is a magnitude of frequency response graph showing the Slim equalization characteristic used in the preferred embodiment of the current invention.
Figure 3:
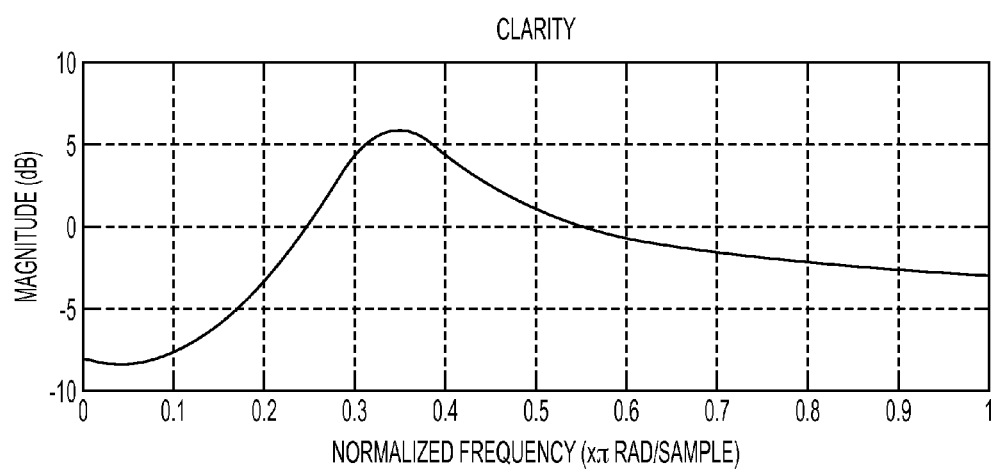
FIG. 3 is a magnitude of frequency response graph showing the Clarity equalization characteristic used in the preferred embodiment of the current invention.
Figure 4:
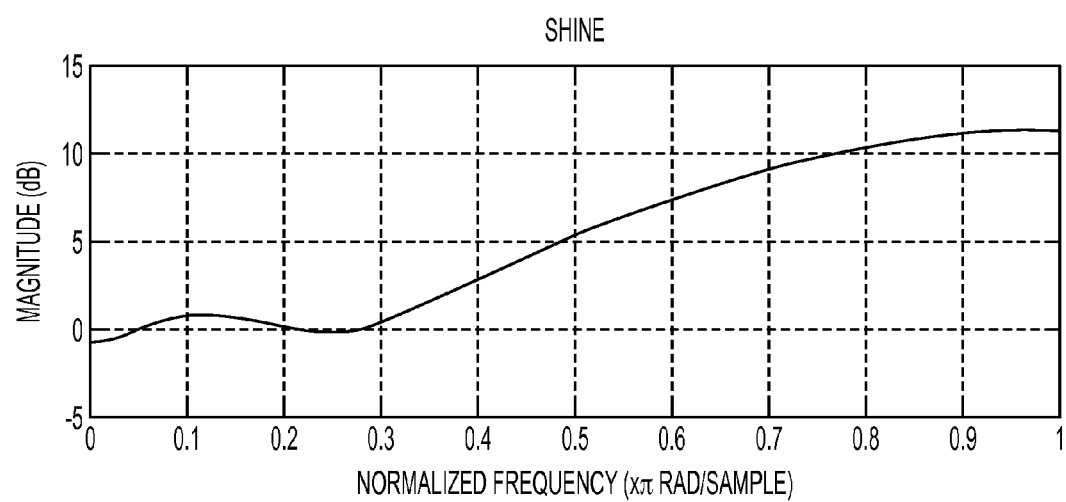
FIG. 4 is a magnitude of frequency response graph showing the Shine equalization characteristic used in the preferred embodiment of the current invention.
Figure 5:
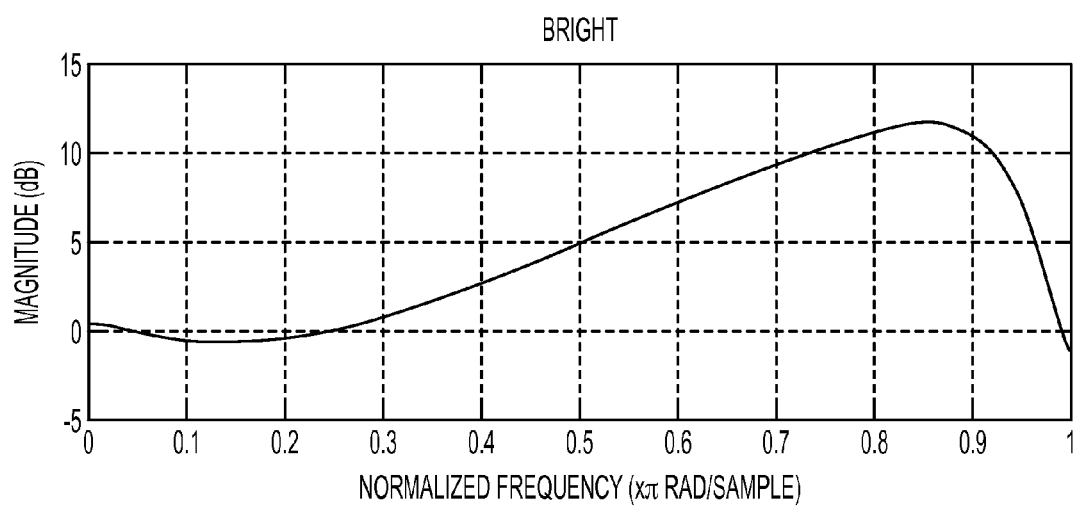
FIG. 5 is a magnitude of frequency response graph showing the Bright equalization characteristic used in the preferred embodiment of the current invention.

FIG. 1 is a flowchart that shows the steps to provide a user with a plurality of selectable audio characteristics, in accordance with an embodiment of the current invention. In a preferred embodiment of the current invention, as explained at steps 102, 104 and 106, the SN detection and reduction process is carried out. In another embodiment of the invention, the audio file can be processed without these steps.

The input audio file is then equalized using the available set of equalizer settings, at step 108. In a preferred embodiment of the current invention, following four equalizer settings are used—Slim, Clarity, Shine and Bright. The magnitude of frequency response graphs showing the equalizer settings are shown in FIGS. 2 to 5 inclusively with the horizontal axis is being normalized so that the value of '1' on the horizontal axis corresponds to half the sampling frequency of the audio file. Various other equalizer settings can also be used depending on the user demand. When four such preset equalizer settings are used a null or neutral equalized signal can be included resulting in five equalized audio files.

At step 110, the activity level for each of the equalized audio files is separately calculated. The activity level is a measure of the loudness of the signal. Various methods for calculating the activity level are known in the art. In a preferred embodiment of the current invention, ITU-T standard P.56, used for measuring speech activity levels, is used for computing the activity level of the equalized audio files.

Thereafter, each equalized signal is modified appropriately to meet the predetermined loudness level defined by a constant, at step 112. In an embodiment of the current invention, a 'loudness multiple' is calculated for each equalized signal, based on the activity level of the equalized signal.

Following equation shows the relationship between the activity level and the loudness multiple:

$$\text{loudness multiple} = \text{predetermined loudness level} / \text{activity level}$$

Each of the equalized signals is then multiplied by the loudness multiple to produce separate audio files having the same loudness level. In an embodiment of the current invention, the predetermined loudness level is selected in such a way that the user is comfortable with listening to the audio file that meets the predetermined loudness level. This can be done by using a feedback mechanism, which gives a suitable range for the predetermined loudness level. In another embodiment of the current invention, the predetermined loudness level is user-selectable.

In an embodiment of the current invention, the activity level is calculated from the audio file and returned in the same units as that of the audio file. The activity level of the audio files takes values between −32768 and +32767. These numbers are the range of a 16-bit A/D converter.

In a preferred embodiment of the invention, the predetermined loudness level is set to be 3162. However, it should be noted that a suitable value for the predetermined loudness level can be selected by variations of this calculation, and does not affect the scope of the current invention.

Further, in case the audio playback is likely to contain a hard-clip, a non-linear compressor is used to soft-clip the audio signal, or to reduce the clipping, at step 114. The use of the non-linear compressor ensures that the signals with excessive peaks do not overload the dynamic range of the signal. The peaks should be compressed in such a way that they do not cause significant audio distortion. Therefore, in an embodiment of the current invention, the non-linear compressor has a hearing-safety aspect for avoiding high level distorted signals being produced.

In a preferred embodiment of the invention, the input audio file is received on a computer, mobile device or telecommunication device with a microprocessor. The input audio file is then processed using the above processes to generate a plurality of modified equalized audio files, with each modified equalized audio file having a consistent loudness level but, different audio characteristics. The user listens to the processed signal through a suitable application, the modified equalized audio files being synchronized to enable the user to change between modified equalized audio files in real time.

In the application, the listener is presented with the list of the available presets. Based on the personal preference and/or the audio file being played back, the user can select the preset equalizer settings. The processed audio file corresponding to the preset equalizer settings is switched to, and played back to the user. Since the loudness level is normalized, and audio characteristics are altered, this application helps the user in comprehending the voice message contained in the audio file.

SN Detection and Reduction

In an embodiment of the current invention a recorded audio file, such as a voicemail message, is processed to detect the presence of an SN. SN detection and reduction is required because, if present, an SN can significantly alter the results of the activity level analysis. Further, in an embodiment of the current invention, the activity level is also used to generate same level of loudness between the pluralities of equalized audio files.

An SN may be created by a slam-down, i.e. the mechanical noise generated, when a 2-piece phone is hung-up, i.e. the sound of a handset hitting the phone body as the handset is placed back on the phone hook. A mobile phone message end click or misdialling touch tone keys while leaving a voicemail message can also generate SNs as can the sound generated by banging of a door or honking of a car horn. The objective of SN detection is to identify the presence of SN in the audio file. If SN is detected to be present in the audio file, SN reduction needs to be performed in order to effectively measure the activity level of the audio file.

Since an SN generated by a slam-down, it is most likely to be present at the end of the audio, in a preferred embodiment of the invention, the audio file is analyzed in reverse from the end to the beginning. However, the audio file can also be analyzed from the beginning, and it does not restrict the scope of the invention in any way.

The spectral variance of the audio file at a given instant of time is compared with a threshold value. In an embodiment of the current invention, audio file is checked for n-seconds from its end. The rationale behind checking the last n seconds is that the SN is most likely to be present in this duration, i.e. a slam-down noise. However, it should be noted that the procedure can be recursively repeated for the entire audio file to detect the presence of any SN present in the audio file.

In the preferred embodiment of the current invention, the value of n is set to be 3, i.e. last three seconds of the audio file are analyzed for a sudden change in spectral variation. It should be noted that the value of n is mentioned here for illustrative purpose only, and it does not restrict the scope of the invention in any way. Alternatively, n could take a value equal to the entire length of the message. Alternatively, the audio file could be broken into segments of n seconds and the analysis performed on the audio file, in whole or in parts, by making SN detection a recursive function.

Figure 6:
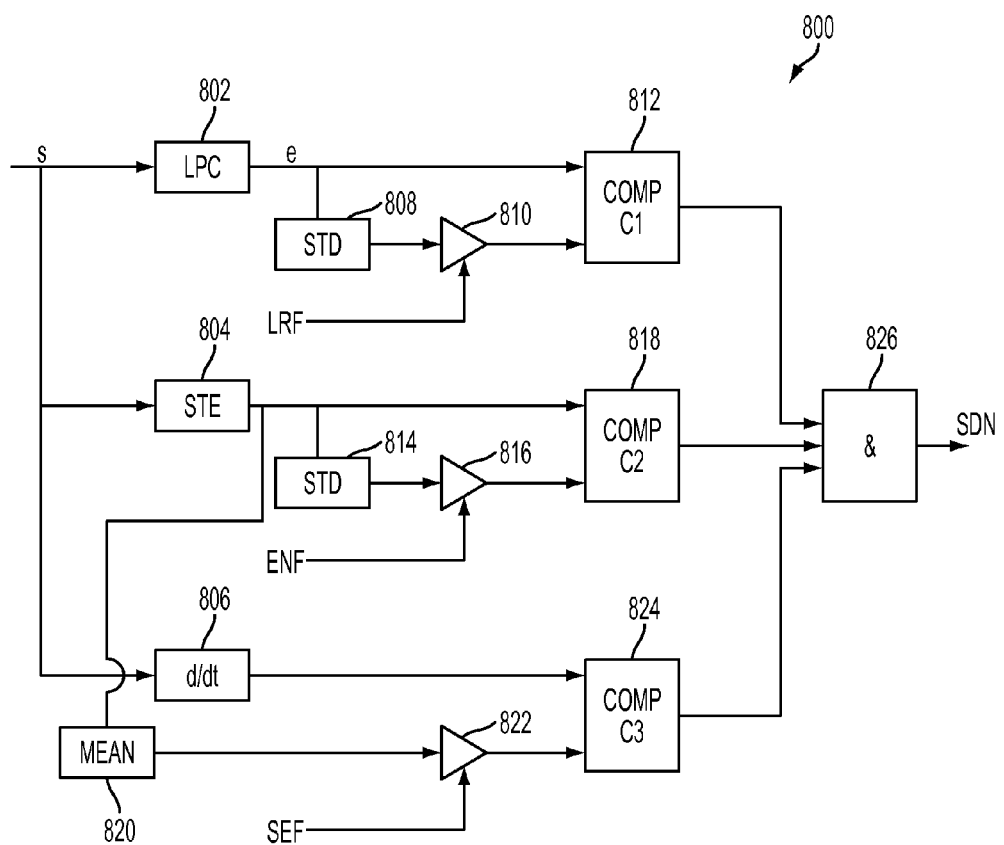
FIG. 6 is a circuit diagram showing an SN detection circuit, in accordance with an embodiment of the current invention.

In an embodiment of the current invention, as shown by the circuit diagram at FIG. 6, the following methodology is used to detect the presence of an SN:

The audio file is segmented into Frames of 20 milliseconds in duration. A Frame is deemed to contain an SN, if all of the following points are true:
 a. LPC Residual Energy>LPC_RES_FACTOR*(standard deviation of the LPC Residual Energy);
 b. Short Term Energy>ENERGY_FACTOR*(standard deviation of the Short Term Energy); and
 c. The first order inter frame time derivative of the Short Term Energy>STE_THRESHOLD*(mean of the Short Term Energy).

In the above embodiment the LPC Residual Energy is the energy in the prediction residual in each Frame resulting from 12th order Linear Predictive Coding (LPC) analysis (autocorrelation method). Short Term Energy is the energy in each Frame.

In a preferred embodiment of the invention, following values are used for LPC RES factor (LPC_RES_FACTOR), Energy factor (ENERGY_FACTOR) and Short term energy threshold (STE_THRESHOLD):
 LPC_RES_FACTOR=4;
 ENERGY_FACTOR=4; and
 STE_THRESHOLD=20.

It will be appreciated that the values of the above mentioned factors are for illustrative purpose only, and they do not restrict the scope of the invention in any way. Suitable values of LPC RES factor, Energy factor and Short term energy threshold can be chosen in the determination of the SN.

In another embodiment of the current invention, the audio file is analyzed from where the spectral variance crossed the threshold, till the time when it gets back to normal spectral variance, i.e. that of the normal human speech. The audio file between these two points is identified as an SN.

In an alternative embodiment of the current invention, power spectral variation is considered to detect SN in the audio file in the similar way as with the energy spectral variation as described in the above preferred embodiment.

In another embodiment of the current invention, the portion of the audio file identified as an SN is eliminated from the audio file, and the rest of the audio file is processed for activity level calculation.

When the SN is a slam-down noise, it has been observed that there is a silence before the receiver of the conventional telephone set is slammed down on the station. The length of this silence can be determined by carrying out various experiments. In general, there is a silence, or pause of 1 to 2 seconds between the point of the audio file where the speech ends, and the point where the handset is put on the station. This is the time between the handset leaving the ear/mouth and being placed on the station. Further, generally, there is a gap of silence after the slam-down noise, which is captured in the voicemail message.

Therefore, in an alternative embodiment of the current invention it is detected whether there is a sudden spectral variance change between two pieces of silence in the audio file. The spectral variation change may also be compared with the threshold value.

The audio file from the first silence occurrence till the end (or till the second silence occurrence) is identified as an SN. In an embodiment of the current invention, the audio file that is free of the SN is then processed for activity level calculation, procedure for which is explained in conjunction with FIG. 1.

In an embodiment of the current invention, if an SN is detected, the activity level is computed for only the part of the message that contains the speech. In other words, the activity level is independent of the length of the audio file and SN. In another embodiment of the current invention, the portion containing the SN is removed from the audio file, and activity level is calculated.

In the preferred embodiment of the current invention, if an SN is detected, the activity level is computed for only part of the audio file. In the preferred embodiment of the current invention, if an SN is detected, the last three seconds of the audio file are not analyzed for activity level.

As described above FIG. 6 is a circuit diagram showing an SN detection circuit, in accordance with an embodiment of the current invention. The SN detection circuit 800 includes an LPC Residual Energy Calculator 802, a Short Term Energy Calculator 804, a Derivative Calculator 806, Standard Deviation Calculators 808 and 814, Mean Calculator 820, Multipliers 810, 816 and 822, Comparators 812, 818 and 824, and a Combinational Circuit 826.

The SN detection circuit 800 receives audio signal 's' as an input. The LPC Residual Energy Calculator 802 calculates the LPC residual energy 'e' from the input audio signal s. The Short Term Energy Calculator 804 calculates the Short Term Energy 'step' from the input signal s. The Derivative Calculator 806 calculates a first order inter-frame time derivative of the Short Term Energy.

The Standard Deviation Calculator 808 takes the LPC residual energy 'e' as an input, and calculates its standard deviation. The Multiplier 810 multiplies the standard deviation of LPC residual energy with the LPC_RES_FACTOR. The Comparator 812 compares the LPC residual energy with the output of the Multiplier 810.

Similarly, the Standard Deviation Calculator 814 takes the Short Term Energy STE as an input, and calculates its standard deviation. The Multiplier 816 multiplies the standard deviation of STE with the ENERGY_FACTOR. The Comparator 818 compares the STE with the output of the Multiplier 816.

Further, the Mean Calculator 820 calculates the mean of the STE. The Multiplier 822 multiplies the output of the Mean Calculator 820 with the STE_THRESHOLD. The Comparator 824 compares the output of the Multiplier 822 with the first order inter-frame time derivative of the STE.

The Combination Circuit 826 performs AND operation on the outputs of the Comparators 812, 818 and 824. A frame of sound is deemed to contain SN, if the outputs from Comparators 812, 818 and 824 are true. In other words, SN is detected in a frame if the output of the Combinational circuit 826 is true.

Figure 7:
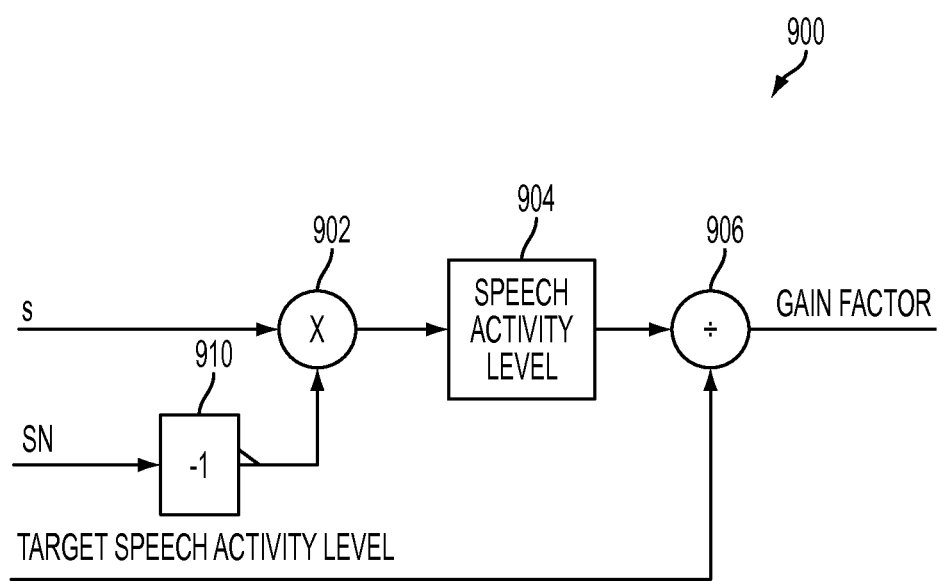
FIG. 7 is a circuit diagram showing a Gain Factor and Speech Activity Level Calculator, in accordance with an embodiment of the current invention.

FIG. 7 is a circuit diagram showing a Gain Factor and Speech Activity Level Calculator, in accordance with an embodiment of the current invention. Gain Factor and Speech Activity Level Calculator 900 includes a Multiplier 902, a Speech Activity Level Calculator 904, and a Divider 906. The Multiplier 902 subtracts the SN received from SN calculator 800 from the input signal s. A suitable block such as an Inverter 910 can be used to provide the complement of SN to the Multiplier 902. The SN eliminated signal i.e. the output of the Multiplier 902 is processed at the Speech Activity Level calculator 904 to estimate the Speech Activity Level of the audio signal. As explained in conjunction with FIG. 1, the Gain Factor (referred to as 'loudness multiple') is calculated by the Divider 906, by using a pre-determined Target Speech Activity Level and the Speech Activity Level as estimated by the Calculator 904.

Figure 8:
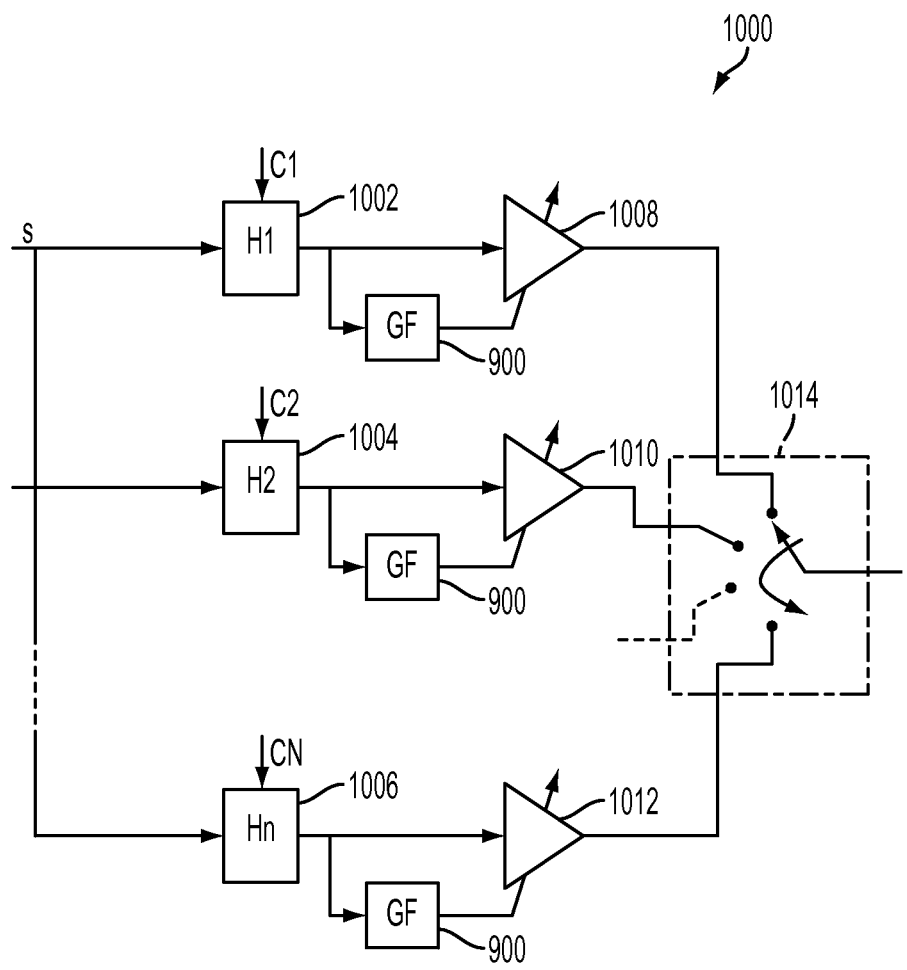
FIG. 8 is a circuit diagram depicting an embodiment of the electrical circuitry used for implementing the current invention.

FIG. 8 is a circuit diagram showing the circuit to implement the invention, in accordance with an embodiment of the current invention. Circuit 1000 includes equalizers 1002, 1004, and 1006, Gain Factor and Speech Activity Level Calculators 900, Amplifiers 1008, 1010 and 1012, and a User Selectable Switching Means 1014.

Audio signal 's' is input to the Equalizer 1002, along with an equalizer pre-set setting, as explained in conjunction with FIGS. 2-5. The output of the equalizer 1002 is sent to the Gain Factor and Speech Activity Level Calculator 900. In an embodiment of the current invention, an arrangement for SN detection and elimination may also be used, as explained in conjunction with FIG. 8. Finally, an Amplifier 1008 is used to scale the audio signal. The Amplifier 1008 may additionally contain a non-linear compressor which ensures that the signals with excessive peaks do not overload the dynamic range of the signal.

Similar arrangements are used for different equalizer pre-sets, to provide different equalization characteristics. The User Selectable Switching Means 1014 enables the user to toggle between the outputs of the Amplifiers and non-linear compressors 1008, 1010 and 1012.

It should be noted that the arrangement of three circuits for providing the user with selectable audio characteristics is shown here for illustrative purposes only, and it does not restrict the scope of the invention in any way. Any number of such circuits can be used, depending on the requirements and the number of pre-sets to be offered.

The method and system for providing a plurality of audio files with consistent loudness levels but different audio characteristics, as described in the present invention, may be embodied in the form of a computer system. Typical examples of a computer system include a general-purpose computer, a programmed microprocessor, a micro-controller, a peripheral IC element, and other devices or arrangements of devices that are capable of implementing the steps that constitute the method of the present invention.

The computer system comprises a computer, an input device, a display unit and the Internet. The computer comprises a microprocessor, which is connected to a communication bus. The computer also includes a memory, which may include Random Access Memory (RAM) and Read Only Memory (ROM). Further, the computer system comprises a storage device, which can be a hard disk drive or a removable storage drive such as a floppy disk drive, optical disk drive, and the like. The storage device can also be other similar means for loading computer programs or other instructions into the computer system.

The computer system executes a set of instructions that are stored in one or more storage elements to process input data. The storage elements may also hold data or other information, as desired, and may be in the form of an information source or a physical memory element present in the processing machine. Exemplary storage elements include a hard disk, a DRAM, an SRAM and an EPROM. Storage elements may also be external to the computer system, and be connected to or inserted into the computer, to be downloaded at or prior to the time of use. Examples of such external computer program products include computer-readable storage mediums such as CD-ROMS, flash chips, floppy disks, and the like.

The set of instructions may include various commands that instruct a processing machine to perform specific tasks, such as the steps that constitute the method of the present invention. The set of instructions may be in the form of a software program. The software may be in various forms, such as system or application software. Further, the software may be in the form of a collection of separate programs, a program module with a larger program, or a portion of a program module. The software may also include modular programming in the form of object-oriented programming. The software program containing the set of instructions can be embedded in a computer program product, for use with a computer, with the computer program product comprising a computer-usable medium that has a computer-readable program code embodied therein. Processing of input data by the processing machine may be in response to users' commands, to the result of previous processing, or in response to a request made by another processing machine.

The modules described herein may include processors and program instructions that implement the functions of the modules described herein. Some or all the functions can be implemented by a state machine that has no stored program instructions, or in one or more application specific integrated circuits (ASICs), in which each function or some combinations of certain of the functions are implemented as custom logic.

In the foregoing specification, the invention and its benefits and advantages have been described with reference to specific embodiments. However, it will be appreciated that various modifications and changes can be made, without departing from the scope of the present invention, as set forth in the claims. Accordingly, the specification and figures are to be regarded in an illustrative rather than a restrictive sense, and all such modifications are intended to be included within the scope of the present invention. The benefits, advantages, solutions to problems, and any element(s) that may cause any benefit, advantage or solution to occur or become more pronounced are not to be construed as critical, required or essential features or elements of any or all the claims. The invention is defined solely by the appended claims, including any amendments made during the pendency of this application and all equivalents of those claims, as issued.

This description includes various embodiments the current invention as claimed herein. The various embodiments described herein do not limit or reduce the nature and scope of the current invention.

Accordingly I hereby claim:

1. A method for processing an audio file to produce a plurality of modified equalized audio files with different audio characteristics but a consistent level of loudness comprising the steps of:
   receiving an audio file;
   generating a plurality of equalized audio files from said audio file;
   modifying each equalized audio file to produce the plurality of modified equalized audio files by:
      determining an activity level of the equalized audio file;
      calculating a loudness multiple from a constant and the activity level; and
      multiplying the equalized audio file by the loudness multiple; and
   synchronizing the plurality of modified equalized audio files for playback permitting a user to switch between the plurality of modified equalized audio files during playback.

2. The method of claim 1, wherein the loudness multiple is calculated from the multiple of the constant and the activity level.

3. The method of claim 1, wherein the method further includes detecting a presence of a sudden, strong noise in the audio file.

4. The method of claim 3, wherein the method further includes reducing the presence of the sudden, strong noise in the audio file.

5. The method of claim 1, wherein the activity level is a speech activity level.

6. The method of claim 1, wherein a plurality of preset equalization profiles is used to create the plurality of equalized audio files.

7. The method of claim 6, wherein the preset equalization profiles are at least two of slim, shine, clarity, bright, and null.

8. A device for processing an audio file to produce a plurality of modified equalized audio files with different audio characteristics but a consistent level of loudness comprising:
   a circuit for receiving an audio file and generating a plurality of equalized audio files, each of the plurality of equalized audio files being modified by the circuit to produce the plurality of modified equalized audio files for storing and playing to a user, the circuit modifying each of the plurality of equalized audio files by measuring an activity level of the equalized audio file against a constant to produce a loudness multiple, and the circuit multiplying the equalized audio file by the loudness multiple, wherein the circuit further synchronizes the plurality of modified equalized audio files for playback permitting the user to switch between the plurality of modified equalized audio files during playback.

9. The device of claim 8, wherein the circuit further comprises a Gain Factor, a Speech Activity Level Calculator, a plurality of Amplifiers, and a User Selectable Switch.

10. The device of claim 9, wherein the circuit further comprises a non-linear compressor in at least one of the Amplifiers.

11. The device of claim 8, wherein the device further includes a circuit for detecting a presence of a sudden, strong noise in the audio file.

12. The device of claim 8, wherein the device further includes a circuit for reducing the presence of the sudden, strong noise in the audio file.

13. A device for processing an audio file to produce a plurality of modified equalized audio files with different audio characteristics but a consistent level of loudness comprising:
   a programmed general-purpose computer for receiving an audio file and generating a plurality of equalized audio files, each of the plurality of equalized audio files being modified by the programmed general-purpose computer to produce the plurality of modified equalized audio files for storing and playing to a user by the programmed general-purpose computer, the programmed general-purpose computer modifying each of the plurality of equalized audio files by measuring an activity level of the equalized audio file against a constant to produce a loudness multiple, and multiplying the equalized audio file by the loudness multiple, wherein the programmed general-purpose computer is further programmed to synchronize the plurality of modified equalized audio files for playback permitting the user to switch between the plurality of modified equalized audio files during playback.

14. The device of claim 13, wherein the audio file, equalized audio files, and modified equalized audio files are stored on a computer-readable storage medium.

15. The device of claim 13, wherein the programmed general-purpose computer is further programmed to detect a presence of a sudden, strong noise in the audio file.

16. The device of claim 13, wherein the programmed general-purpose computer is further programmed to reduce the presence of the sudden, strong noise in the audio file.

* * * * *